United States Patent [19]

Robb

[11] 4,171,903
[45] Oct. 23, 1979

[54] VARIABLE PUNCH PRESS SYSTEM FOR FOUR COLOR WORK

[76] Inventor: Maurice R. Robb, 12240 Arrow Park, Tantallon, Md. 20022

[21] Appl. No.: 932,477

[22] Filed: Aug. 10, 1978

[51] Int. Cl.² ............................................. G03B 29/00
[52] U.S. Cl. ................................... 355/29; 33/184.5; 355/32; 355/85; 355/88; 355/132
[58] Field of Search ...................... 355/32, 29, 85, 88, 355/132; 33/184.5

[56] References Cited

U.S. PATENT DOCUMENTS

| | | | |
|---|---|---|---|
| 1,716,989 | 6/1929 | Troland | 355/88 |
| 1,880,087 | 9/1932 | Guerin | 355/88 |
| 3,000,737 | 9/1961 | Barnhart | 355/32 |
| 3,067,666 | 12/1962 | Coffman | 355/113 |
| 3,264,106 | 8/1966 | Alldis | 96/41 |
| 3,436,149 | 4/1969 | Wicker | 355/85 |
| 3,798,782 | 3/1974 | Lindahl | 33/184.5 |

Primary Examiner—Richard A. Wintercorn
Attorney, Agent, or Firm—John F. McClellan, Sr.

[57] ABSTRACT

An automatic registration system for four-color image stripping employs in one embodiment a first punching press having a grid pattern die on which a "MYLAR" sheet carrier with desired windows is laid, and, on this, single color images are laid at the respective windows; registration holes are then punched at selectable positions keying the single color images to the carrier by use of a correspondingly-grid-patterned transparent punch holder providing good visual access for selection of positions in the grid pattern at which to mount punches, and a ram which drives the punches against compression-spring bias. Following perforation of the registration holes in the Mylar sheet carrier, each single color image is removed and matched with the remaining single color images of the four-color set to which it belongs, with appropriate locator pins inserted in pre-punched holes customarily supplied in each for the color separation stage keying them together. Next, in this embodiment the remaining single color images of the set are power-punched with a second punching press to perforate them all at positions corresponding to registration holes perforated in the one single color image of the set by the first punching press. Following this, the single color images may then be individually placed by relating each in turn through the registration holes to the Mylar sheet carrier windows, at which register pins are provided for the purpose; use of a single punching press for performing the entire operation is also disclosed.

5 Claims, 6 Drawing Figures

VARIABLE PUNCH PRESS SYSTEM FOR FOUR COLOR WORK

The invention relates generally to systems for color transfer and specifically to punch systems for registration of successive colors, in form, in four-color processes and the like.

One of the major factors contributing to high labor cost in lithography, gravure, and letterpress printing is the ever-present need to register each four color subject individually and in exact relation to others of the set. This task of registering four color work is extremely time consuming and requires highly skilled personnel who are not always available to the industry. Because each individual piece of film requires individual registering, substantial time loss often results from lack of register points and/or miscalculations in the reading of register points. A principal object of the invention therefore, is to eliminate the present need in the graphic arts industry to register each piece individually. The system of this invention is intended to provide a variable punching press which if used in proper manner would enable the user to register entire four color forms without the need of highly skilled personnel.

The present method used for making four color separations is, first, to prepunch two holes in register in each of the four pieces of film prior to making the four color separation so as to provide means to maintain proper screen angles and image registration. Depending on the method used, the film is then individually mounted by the holes on pins located on a camera, scanner, or an enlarger. Once the separations are done, they then require individual stripping.

Generally, then, objects of the invention are not only to use the prepunched film in original form, but also to permit greater flexibility through the use of a multiple punch to create a new set of holes relative to the specific placement of the subject being positioned in any particular form, eliminating the use of visual aids and of registration judgment as required methods for stripping entire four color forms, and assuring greater accuracy and greater speed for all four color work, without concern for misregister from human error, or the current shortage of skilled personnel.

Further objects are to provide an economical, efficient, easily learned, easily used system employing durable apparatus.

In the prior art various disclosures for aiding color plate work have been made, including those in the following U.S. Pat. Nos.:

3,798,782 to P. C. Lindahl, Mar. 26, 1974 discloses transferring alignment from large holes to specially pin-punched small holes using a grid, in registering film;

3,436,149 to R. C. Wicker, Apr. 1, 1969, discloses registration of negatives using pins and a transparent member;

3,264,106 to H. H. Alldis, Aug. 2, 1966, discloses registration using pins and a pin registration board with holes on one-half inch or greater spacings, identification for the holes, and use of pins as punches;

3,067,666 to J. W. Coffman, Dec. 11, 1962, discloses use of alignment pins in registration;

1,880,087 to P. J. Guerin, Sept. 27, 1932, discloses substitution of reference holes using aligning pins;

1,716,989 to L. T. Troland, June 11, 1929, discloses the use of pins in aligning.

Stated again, although as indicated it has been customary to prepunch holes in unexposed film to insure proper register and proper screen angles in making four color separations, once the color separations are made, the prepunched holes are, in current known practice, not exploited as in the present invention, and the single color images are individually stripped into specific window placement.

Generally, then, in contrast, with this current practice, additional objects of the invention are to use further the prepunched holes and at the same time to provide greater flexibility, speed, ease and accuracy through creating at pre-selectable positions a new set of registration holes relative to each specific window placement, by means for which each single color image of a form can be properly stripped by anyone, skilled or not.

In brief summary given for cursive description only and not as limitation, the invention includes a press system having a transparent punch holder coacting with a die and a ram, facilitating pre-selection of hole locations for simultaneously perforating location holes in single color images and in a conventional "Mylar" sheet carrier adjacent windows in the carrier at which the single color images are positioned, and means for transferring the hole locations to the other single color images of the respective forms, permitting automatic one-step stripping of the single color images.

The above and other objects and advantages of this invention will become more readily apparent on examination of the following description, including the drawings in which like reference numerals refer to like parts:

Details in the Figures are simplified for exposition.

Figure 1:
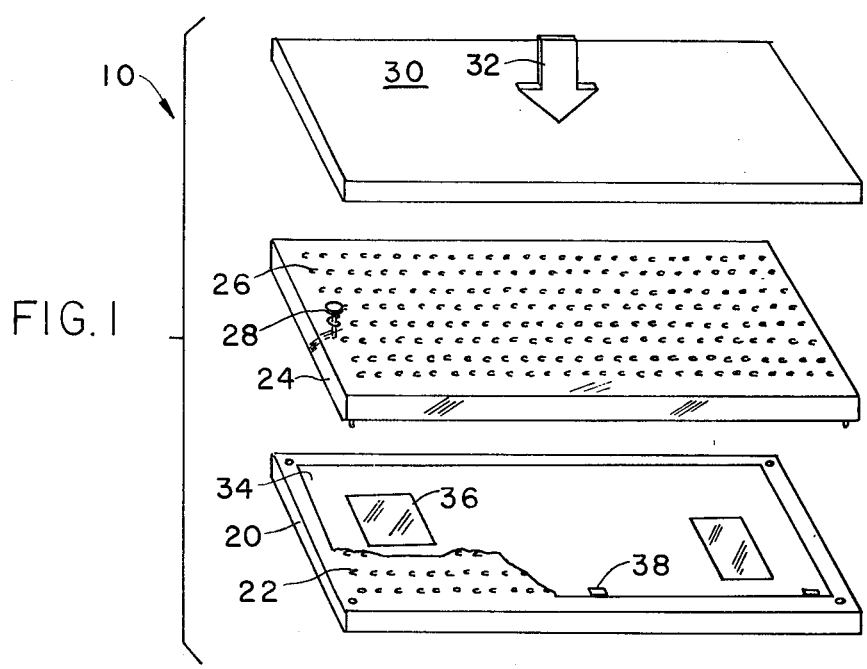
FIG. 1 is a fragmentary perspective diagram of the die of this invention overlaid with a sheet carrier having windows and with a transparent punch holder and ram spaced above it in operative position.

FIG. 1 diagrams details of the punching press 10 of the invention, comprising a die 20 with a grid pattern of punch holes 22 through it, above the die a transparent punch holder 24 with a corresponding grid pattern of punch holes 26 sized to hold individual punches 28 at selectable locations, and above the transparent punch holder, a ram 30 with conventional means diagrammed by arrow 32 for moving or directing the ram downward and in alignment relative to the transparent punch holder and die to punch holes. This means may be any suitable vertical way system, such as a hydraulic piston assembly uniting die and ram at each corner and having a common fluid supply, the movement preferably being translatory.

The grid size may provide one inch (25 mm) spacing between die holes, in rectangular pattern, and the die holes may be ⅛ inch (3 mm) in diameter. The punching press may be of any dimension but for standard printing forms could advantageously be 30×40 inches (76×101 cm), providing about 1200 holes with border.

A conventional "Mylar" sheet carrier 34 with windows 36 (representing any number and arrangement desired at preselected locations) is shown laid over the die, to which it may be secured by conventional matrix pins 38, in a first step in a method employing the apparatus of the invention. The "Mylar" sheet carrier is shown partially broken away for exposition.

Figure 2:
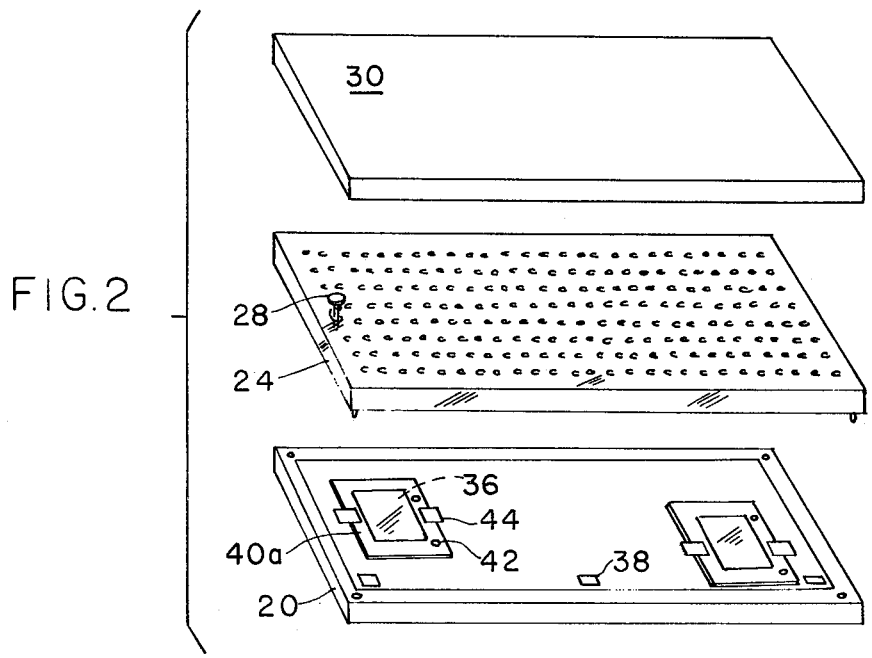
FIG. 2 is a similar diagram showing single color images over the windows preparatory to punching.

FIG. 2 shows the next step, the overlaying of the "Mylar" sheet carrier with respective single color images 40a, to be placed at the windows. Holes 42 which normally are prepunched in the film for color separation to assure proper registration and screen angle of each single color image with the others of the set are shown also but are not used in this step.

Tape 44 may be used to hold the single color images in place.

Figure 3:
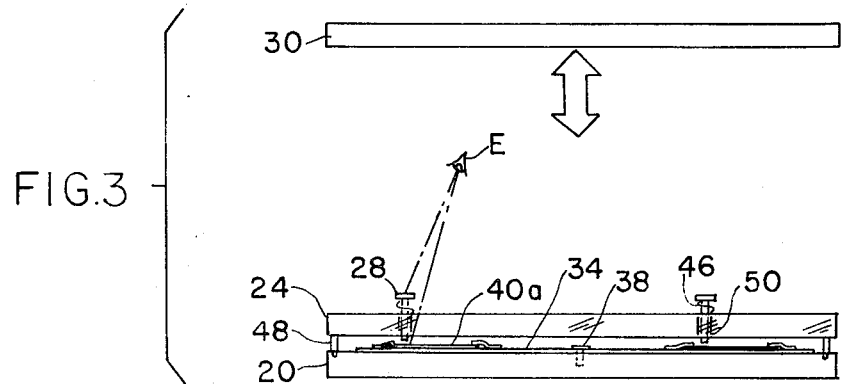
FIG. 3 is a side elevational diagram indicating insertion of punches in selected holes in punch holder, and ram suspended over punch holder and die.

FIG. 3 diagrams the succeeding step of inserting headed punches 28 in the transparent punch holder 24 at locations selected by eye, in preparation for punching registration holes through the single color image 40 a', and "Mylar" sheet carrier 34. A spring 46 under the head of each punch keeps it clear of the work until depressed by the ram. Placement of punches in selected punch locations according to the invention is thus positive by direct visual check, without need for number or letter locations. Legs 48 at the corners of the punch holder locate it on the die which has corresponding holes for the purpose. Final check before punching can be made at a glance from above (in a spacing provided by making the upward stroke of the directing means sufficiently long) as indicated by the eye E and dashed lines. Metal liners 50 reinforce and wearproof the punch holes. The liners are thin shells which obscure little.

Figure 4:
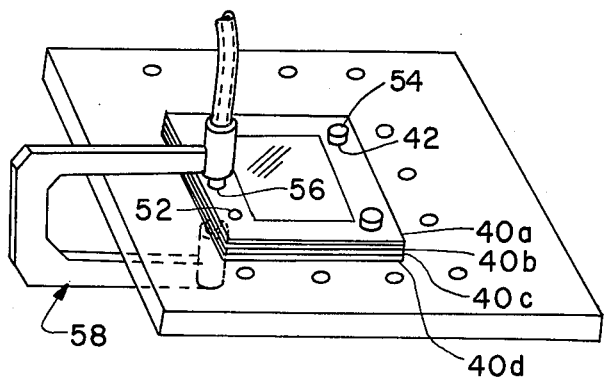
FIG. 4 is a perspective diagram of an embodiment showing four color images held in alignment by pins in scanner holes and with a conventional small punch punching registration holes in remaining color images, guided by pins in registration holes previously punched in the single color image on the punching press.

FIG. 4 indicates typical registration holes 52 which were punched through the single color image 40a in the step of the preceding Figure, and shows a step of transferring these registration hole locations to the other single color images 40b, 40c, 40d, of the set.

For the transfer, pins 54 through the prepunched holes 42 are used to align the single color images, and the punch 56 of a second punching press 58 is inserted for guidance into a registration hole of the first-punched single color image and then punched through the remainder of single color images. (This punch is conventional and may have a guide pin at the bottom engaging alignment holes in the die).

This is repeated for each registration hole, providing in all single color images of the set corresponding holes for registering all the single color images with each other and with the holes in the "Mylar" sheet carrier to permit automatically aligning stripping.

The second punching press may be a single-punch, pneumatically driven punching press or any equivalent device for the purpose.

For example, the second punching press may alternatively be similar to the variable punching press of this invention, with holes spaced precisely the same in a pattern and with a plural-punch ram movably adapted to punch the holes where required for the transfer. Or the need for a second punching press may be eliminated by employing the first or variable punching press of this invention to do the whole job, and this may be done in one operation, substituting the stacked single color images keyed together by pins in the pre-punched holes, for the one single color image in the FIG. 3 step. An electric or pneumatic drill can be used to penetrate the additional thickness, if desired.

Holes punched by the second punching press in any case are identical in diameter with those punched by the first punching press.

Figure 5:
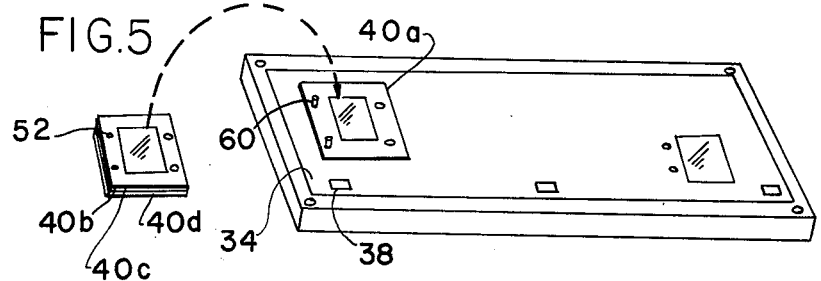
FIG. 5 is a perspective view indicating resultant automatic pin-guidance for stripping individual color images when burning-in images.

FIG. 5 indicates the step of placing the single color images 40a, 40b, 40c, 40d, in sequence, using reference pins 60 inserted into corresponding die holes through the newly punched registration holes 52 in each single color image and in the "Mylar" sheet carrier 34.

Figure 6:
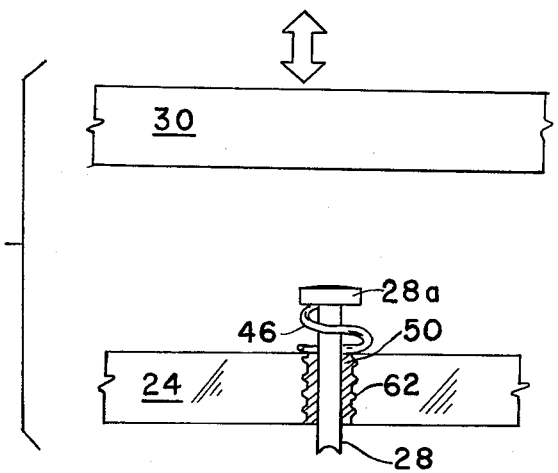
FIG. 6 is an enlarged side elevational diagram partially in section of a portion of a punch holder with punch and a ram.

FIG. 6 details a fragment on a larger scale showing the relation of the transparent punch holder 24 and ram 30 to a punch 28 in preferred embodiment. The metal inserts or liners 50 may be affixed by screw threads 62 as shown flush with the edges of the transparent punch holder 24. The head 28a of the punch may be crowned slightly. 46 denotes the spring conventionally supplied with headed punches, attached to them. The ram can be a flat-ground steel sheet hardened sufficiently to prevent punch heads from indenting it.

Each punch may be of tool steel, ⅛ inch (3 mm) in diameter, and the punch carrier although indicated as thicker for expositional purposes may be of "Lucite" or "Plexiglass" or equivalent, one inch (2.5 cm) thick. The die may be of tool steel, two inches (5 cm) thick; the holes pass through the die in conventional manner.

It will be appreciated that the concept of the invention may be practiced through the use of data process in conjunction with a feed tape system wherein the grid of punch holes would correspond directly to a computer readout for image placement.

This invention is not to be construed as limited to the particular forms disclosed herein, since these are to be regarded as illustrative rather than restrictive. It is, therefore, to be understood that the invention may be practiced within the scope of the claims otherwise than as specifically described.

Further, it is to be understood that the terms sheet carrier and film carrier have the same meaning for purposes of this invention.

What is claimed and desired to be protected by United States letters patent is:

1. A punching system for punching registration holes in a film carrier at at least one window and in color images to be placed successively thereon in registration relative to said window, comprising: a die having a plurality of holes therein in a grid pattern, a punch holder having a plurality of holes therein in a grid pattern corresponding to said grid pattern of the die, a plurality of punches slidably actuable downward in respective holes selectable in the punch holder plurality of holes, means biasing upward each said punch, means for holding the punch holder in spacing over the die with said grid pattern of the die in correspondence with the grid pattern of the punch holder, said spacing permitting film carrier and color image placement on said die in spacing below the punch holder and permitting each said punch on slidable actuation downward to enter a respective hole in the die, a punch ram, and means having upward and downward strokes for directing the punch ram to actuate said punches downward for film carrier and color image punching to produce said registration holes.

2. A punching system as recited in claim 1, and means permitting direct visual selection of holes in the punch carrier plurality of holes in which to place punches for punching holes for said window registration comprising: the punch holder being substantially transparent.

3. A punching system as recited in claim 2, said means for directing providing spacing beneath the ram for visual access downward through the transparent punch holder to the die.

4. A punching system as recited in claim 3, a liner in each of said visually selectable holes in the transparent punch holder.

5. A method of producing registration holes for registering in succession a plurality of color images at a window in a film carrier comprising the steps:
- (a) prepunching a plurality of color images with first holes for maintaining screen angle and image registration among said plurality of color images;
- (b) laying the film carrier on a die having a grid of punch holes;
- (c) laying a first one of said plurality of color images in desired location on said window of the film carrier;
- (d) spacing a transparent punch holder, having a grid of punch holes corresponding to the die grid of punch holes, over the die with said grid of punch holes of the transparent punch carrier in correspondence with the grid of punch holes in the die;
- (e) visually observing through the transparent punch holder desired locations on the film carrier for said registration holes most nearly corresponding to said punch holes in the transparent punch holder;
- (f) inserting punches respectively into said most nearly corresponding punch holes in the punch carrier;
- (g) punching registration holes in said first one of the color images by forcing said inserted punches through said first one of the color images and through the film carrier into respective holes in the die;
- (h) producing registration holes in the remaining ones of said plurality of color images by:
  - (i) keying all said color images together using said prepunched holes, and
  - (ii) guiding on and punching through the registration holes in said first color image and thence through said remaining ones of said plurality of color images, thereby producing registration holes in said plurality of color images for registering in succession said plurality of color images relative to a window in a film carrier.

* * * * *